United States Patent
Adusumilli et al.

(10) Patent No.: US 12,457,823 B2
(45) Date of Patent: Oct. 28, 2025

(54) PHOTODETECTOR STRUCTURE WITH AIR GAP AND RELATED METHODS

(71) Applicant: GlobalFoundries U.S. Inc., Malta, NY (US)

(72) Inventors: Siva P. Adusumilli, South Burlington, VT (US); Ramsey Hazbun, Colchester, VT (US); John J. Ellis-Monaghan, Grand Isle, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 621 days.

(21) Appl. No.: 17/820,979

(22) Filed: Aug. 19, 2022

(65) Prior Publication Data
US 2024/0063315 A1 Feb. 22, 2024

(51) Int. Cl.
*H10F 77/40* (2025.01)
*H10F 30/223* (2025.01)
*H10F 71/00* (2025.01)
*H10F 77/122* (2025.01)

(52) U.S. Cl.
CPC ......... *H10F 77/413* (2025.01); *H10F 30/223* (2025.01); *H10F 71/1212* (2025.01); *H10F 77/122* (2025.01)

(58) Field of Classification Search
CPC ...... H10F 77/413; H10F 77/122; H10F 77/50; H10F 30/223; H10F 71/1212; H10F 39/014; H10F 39/807; H10F 39/8033
See application file for complete search history.

(56) References Cited

U.S. PATENT DOCUMENTS

| | | |
|---|---|---|
| 7,777,250 B2 | 8/2010 | Lochtefeld |
| 7,790,495 B2 | 9/2010 | Assefa et al. |
| 7,795,064 B2 | 9/2010 | Pan et al. |
| 8,350,301 B2 | 1/2013 | Miura et al. |
| 9,864,138 B2 | 1/2018 | Coolbaugh et al. |
| 10,119,857 B2 | 11/2018 | Li et al. |
| 10,157,947 B2 | 12/2018 | Chen et al. |
| 10,168,478 B2 | 1/2019 | Babakhani et al. |
| 10,388,806 B2 | 8/2019 | Chen et al. |

(Continued)

OTHER PUBLICATIONS

Ackland, B., Rafferty, C., King, C., Aberg, I., O'Neill, J., Sriram, T., Lattes, A., Godek, C. and Pappas, S., (Jun. 2009). "A Monolithic Ge-on-Si CMOS Imager for Short Wave Infrared." In International Image Sensor Workshop.

(Continued)

*Primary Examiner* — Sitaramarao S Yechuri
(74) *Attorney, Agent, or Firm* — Francois Pagette; Hoffman Warnick LLC

(57) ABSTRACT

A photodetector structure includes a first semiconductor material layer over a doped well in a substrate. The photodetector structure includes an air gap vertically between the first semiconductor material layer and a first portion of the doped well. The photodetector structure includes an insulative collar on the first portion of the doped well and laterally surrounding the air gap. The photodetector structure may include a second semiconductor material layer on the first portion of the doped well and laterally surrounded by the insulative collar. The photodetector structure may include a third semiconductor layer over the first semiconductor layer.

19 Claims, 10 Drawing Sheets

(56) References Cited

U.S. PATENT DOCUMENTS

| | | |
|---|---|---|
| 10,861,888 B2 | 12/2020 | Na et al. |
| 11,322,639 B2 | 5/2022 | Levy et al. |
| 11,749,762 B2 | 9/2023 | Chiang et al. |
| 2005/0258450 A1* | 11/2005 | Saxler ................ H10D 30/4755 257/E29.05 |
| 2008/0070355 A1 | 3/2008 | Lochtefeld et al. |
| 2011/0037133 A1 | 2/2011 | Su et al. |
| 2014/0159183 A1 | 6/2014 | Na et al. |
| 2015/0130017 A1* | 5/2015 | Han ..................... H10D 62/118 257/522 |
| 2015/0325736 A1 | 11/2015 | Knoll et al. |
| 2016/0155884 A1 | 6/2016 | Hon et al. |
| 2016/0172410 A1 | 6/2016 | Kurokawa |
| 2017/0025562 A1 | 1/2017 | Knoll et al. |
| 2017/0162433 A1 | 6/2017 | Yang et al. |
| 2020/0020734 A1 | 1/2020 | Wang et al. |
| 2021/0057462 A1 | 2/2021 | Stamper et al. |
| 2021/0091246 A1 | 3/2021 | Chern |
| 2021/0210543 A1 | 7/2021 | Hseih et al. |
| 2021/0313373 A1 | 10/2021 | Adusumilli et al. |
| 2022/0367750 A1* | 11/2022 | Yu ......................... H10F 71/127 |
| 2023/0317869 A1 | 10/2023 | Krishnasamy et al. |
| 2025/0006856 A1 | 1/2025 | Lischke |

OTHER PUBLICATIONS

U.S. Appl. No. 17/664,741, Application as filed on May 24, 2022, 38 pages.

Jeon et al., "Buried Air Gap Structure for Improving the Breakdown Voltage of SOI Power MOSFET's," downloaded on Apr. 25, 2025 from IEEE Xplore, Proceedings IPEMC 2000. Third International Power Electronics and Motion Control Conference (IEEE Cat. No.00EX435), Beijing, China, 2000, pp. 1061-1063 vol. 3, doi: 10.1109/IPEMC.2000.882975.

U.S. Appl. No. 17/664,741, Office Action dated Jul. 24, 2025, 36 pages.

* cited by examiner

PHOTODETECTOR STRUCTURE WITH AIR GAP AND RELATED METHODS

BACKGROUND

The present disclosure relates to photonics, and more specifically, to photodetector structures including an air gap and related methods.

Photodetectors, also known as photosensors, sense electromagnetic radiation (e.g., light) and convert the radiation to electronic signals. Photodetectors may include, for example, photodiodes and photo transistors, among other structures. A photodetector may include a P-N or a P-I-N junction that converts photons into electrical current. A "PIN photodetector" is a diode with an undoped intrinsic semiconductor region between a p-typed semiconductor and an n-type semiconductor region. PIN photodetector performance may be inhibited by dark current, which is a small electric current that flows through photosensitive devices even when no photons are entering the device and is a primary source of noise in photonic sensors. Dark current, when present, may have negative effects on photodetector performance.

SUMMARY

All aspects, examples and features mentioned below can be combined in any technically possible way.

An aspect of the disclosure provides a photodetector structure, including: a first semiconductor layer over a first portion of a doped well in a substrate. An air gap vertically between the first semiconductor layer and the first portion of the doped well. An insulative collar laterally surrounding the air gap, the insulative collar on the first portion of the doped well between the air gap and a second portion of the doped well.

Another aspect of the disclosure includes any of the preceding aspects, and a photodetector structure, including: a first semiconductor layer over a first portion of a doped well in a substrate. A second semiconductor layer on the first portion of the doped well. The first semiconductor layer and the second semiconductor layer including epitaxial germanium. An air gap vertically between the first semiconductor layer and the second semiconductor layer. An insulative collar laterally surrounding the air gap, the insulative collar on the first portion of the doped well between the second semiconductor layer and a second portion of the doped well.

An aspect of the disclosure includes any of the preceding aspects, and a method of forming a photodetector structure, the method including: forming a first semiconductor layer over a first portion of a doped well in a substrate. Forming an air gap vertically between the first semiconductor layer and the first portion of the doped well. Forming an insulative collar laterally surrounding the air gap, the insulative collar on the first portion of the doped well between the air gap and a second portion of the doped well.

Another aspect of the disclosure includes any of the preceding aspects, and a photodetector structure, including: a first semiconductor layer over a first portion of a doped well in a substrate. A second semiconductor layer on the first portion of the doped well. A third semiconductor layer over the first semiconductor layer. The first semiconductor layer and the second semiconductor layer including epitaxial germanium, and the third semiconductor layer including polysilicon. The first semiconductor layer including coalesced germanium.

Another aspect of the disclosure includes any of the preceding aspects, and a photodetector structure, including: an air gap vertically between a first semiconductor layer and a first portion of a doped well. The first semiconductor layer on an upper surface of a second portion of the doped well and extending over the air gap. An insulative collar laterally surrounding the air gap. The insulative collar including an oxide on the first portion of the doped well between the air gap and the second portion of the doped well. An upper surface of the insulative collar is substantially coplanar with the upper surface of the second portion of the doped well. The air gap, the insulative collar, and the first semiconductor layer are horizontally adjacent to a trench isolation structure.

Another aspect of the disclosure includes any of the preceding aspects, and a photodetector structure, including: an air gap positioned within a trench isolation structure.

Another aspect of the disclosure includes any of the preceding aspects, and a photodetector structure, including: a first semiconductor layer over a first portion of a doped well in a substrate and on an upper surface of a second portion of the doped well. A first insulative layer over the second portion of the doped well, and horizontally contacting a lower portion of the first semiconductor layer. An inter-layer dielectric (ILD) over the first insulative layer. A contact structure disposed within the ILD and electrically coupled to the first semiconductor layer. The first insulative layer including an oxide, and the ILD including borophosphosilicate glass.

An aspect of the disclosure includes any of the preceding aspects, and a method of forming a photodetector structure, the method including: forming a first semiconductor layer extending over an air gap and a first portion of a doped well in a substrate. Forming the first semiconductor layer includes epitaxially growing germanium on an upper surface of a second portion of the doped well. Forming a second semiconductor layer on the first portion of the doped well. Forming an insulative collar laterally surrounding the second semiconductor layer. Forming a third semiconductor layer over the first semiconductor layer. Forming the second semiconductor layer includes epitaxially growing germanium and forming the third semiconductor layer includes depositing polysilicon. Forming a trench isolation structure within the substrate. The air gap, the insulative collar, and the first semiconductor layer are horizontally adjacent to the trench isolation structure.

An aspect of the disclosure includes any of the preceding aspects, and a method of forming a photodetector structure, the method including: forming a trench isolation structure within the substrate. Forming an air gap positioned within the trench isolation structure.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
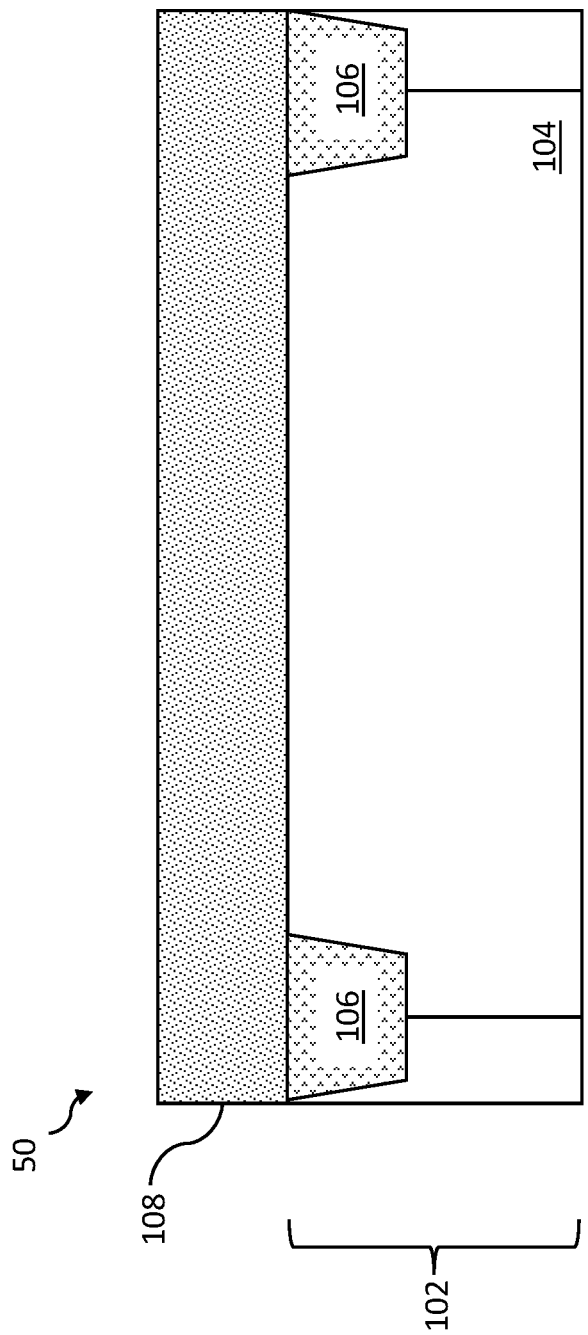
FIG. 1 shows a cross-sectional view of a preliminary structure to be processed, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

A photodetector structure according to embodiments of the disclosure may provide, e.g., a germanium photodetector configured to generate an electrical signal in response to detecting electromagnetic radiation from a transmission source. The photodetector structure includes a substrate and a doped well having a first portion and a second portion positioned therein. The photodetector structure further includes a first semiconductor layer such as, e.g., epitaxial germanium, positioned on the second portion of the doped well and extending over the first portion of the doped well. The photodetector structure includes an air gap positioned vertically between the first semiconductor layer and the first portion of the doped well. The air gap is configured to increase absorption of light and overall efficiency of the photodetector structure. The photodetector structure further includes an insulative collar on the first portion of the doped well and surrounding the air gap to electrically isolate the air gap from the second portion of the doped well.

In some embodiments, the photodetector structure includes a germanium layer on a first portion of a doped well within a substrate. The photodetector structure may include an insulative collar such as, e.g., an oxide, positioned on the first portion and laterally surrounding the germanium layer to electrically isolate the germanium layer from a second portion of the doped well.

In some embodiments, the photodetector structure includes a polysilicon layer over a germanium layer.

In some embodiments, the photodetector structure includes self-coalesced germanium that is epitaxially grown on a portion of a doped well and extends over another portion of the doped well, forming an air gap therein.

In some embodiments, a photodetector structure includes an air gap positioned within a trench isolation structure. In other embodiments, the photodetector structure includes an air gap positioned horizontally adjacent to a trench isolation structure.

In some embodiments, the photodetector structure includes a plurality of pixels positioned adjacent to each other in a respective cavity within a doped well. Each pixel may include a first semiconductor layer such as, e.g., epitaxial germanium, positioned on a portion of the doped well and extending over another portion of the doped well to form an air gap in a respective cavity. Each pixel may electrically couple to one or more other photodiodes of the plurality of diodes and/or other electrical components.

Referring to FIG. 1, a preliminary structure 50 to form a photodetector structure according to embodiments of the disclosure is shown. Preliminary structure 50 may be processed as described herein to yield a photodetector structure according to embodiments of the disclosure. However, it is understood that other techniques, ordering of processes, etc., alternatively may be implemented to yield a photodetector according to the disclosure. FIG. 1 shows a cross-section view of preliminary structure 50 with a substrate 102, e.g., one or more semiconductor materials. Substrate 102 may include but is not limited to silicon, germanium, silicon germanium, silicon carbide, or any other common semiconductor substrates. A portion or entire semiconductor substrate 102 may be strained.

Substrate 102 may be an n-type semiconductor, i.e., a semiconductor material listed above and doped with an n-type dopant. N-type dopants are introduced into a semiconductor to generate free electrons (by "donating" electrons to the semiconductor) and have one more valance electron than the semiconductor. Common n-type dopants in a semiconductor such as silicon include: phosphorous (P), arsenic (As) or antimony (Sb).

For purposes of reference, a doped well 104 within substrate 102 of preliminary structure 50 is illustrated. Preliminary structure 50 may include one or more trench isolation structures 106 within substrate 102. Each trench isolation structure 106 may include a trench etched into substrate 102 and filled with an insulating material such as an oxide (e.g., silicon oxide), insulative semiconductor, etc., to isolate one region of the substrate from an adjacent region of the substrate. Substrate 102 may include a variety of doped wells therein for formation of different polarity photodetector structures. Doped well 104 includes a first dopant type formed using any appropriate n-type or p-type dopant and may be formed using any now known or later developed technique (e.g., in-situ doping or ion implantation). Subsequent processing of preliminary structure 50 may include forming a second doped region having an opposite doping polarity than doped well 104 to define a "PIN photodetector." The term "PIN" refers to two regions having different types of conductivity (i.e., P-type and N-type), which may be induced through dopants within the two regions, which are separated by an intrinsic region having undoped semiconductor material (i.e., I-Type) therein.

Preliminary structure 50 may include an insulative layer 108 over substrate 102. Insulative layer 108 may be formed of, e.g., any now known or later developed insulative material such as but not limited to oxides (e.g., silicon oxide). Insulative layer 108 may be formed using deposition and/or any other technique to form a material on substrate 102.

As used herein, "depositing" may include any now known or later developed techniques appropriate for the material to be deposited including but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
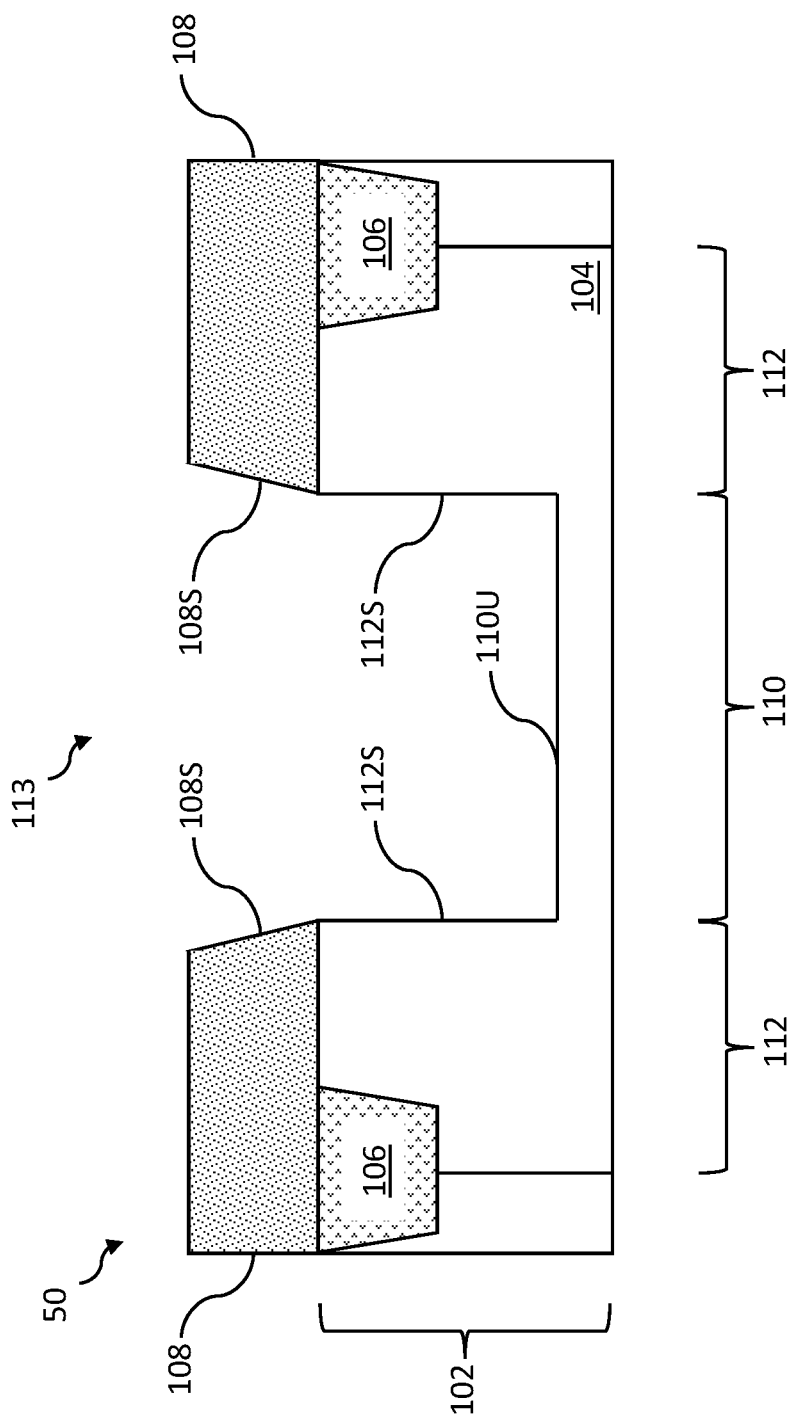
FIG. 2 shows a cross-sectional view of forming a well cavity according to embodiments of the disclosure.

Referring now to FIG. 2, embodiments of the disclosure may include removing portions of insulative layer 108 using, e.g., a mask (not shown) with an opening at a targeted position to expose insulative layer 108. This removal process may include, forming a mask patterned to expose selected portion(s) of insulative layer 108. Masks may include any now known or later developed appropriate masking material, e.g., a nitride hard mask. Any appropriate etching process, e.g., a reactive ion etch (RIE), can remove selected portion(s) of insulative layer 108. As shown in FIG. 2, continued processing may include removing portions of insulative layer 108 and substrate 102 thereunder to yield a first portion 110 of doped well 104 and a second portion 112 of doped well 104 within a well cavity 113. Insulative layer 108 is selectively removed over first portion 110 of doped well 104, and remnants of insulative layer 108 are over second portion 112 of doped well 104 and a sidewall surface(s) 108S of insulative layer 108 are exposed. Well cavity 113 is formed in substrate 102 to expose an upper surface 110U of first portion 110, and a sidewall surface(s) 112S of second portion 112.

As discussed herein, insulative layer 108 may be removed, in part, by etching. Etching generally refers to the removal of material from a substrate (or structures formed on the substrate) and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive ion etching (RIE) operates under conditions intermediate between sputter and plasma etching and may be used to produce deep, narrow features, such as shallow trench isolation (STI) trenches. In this case, a RIE may be used, for example.

Figure 3:
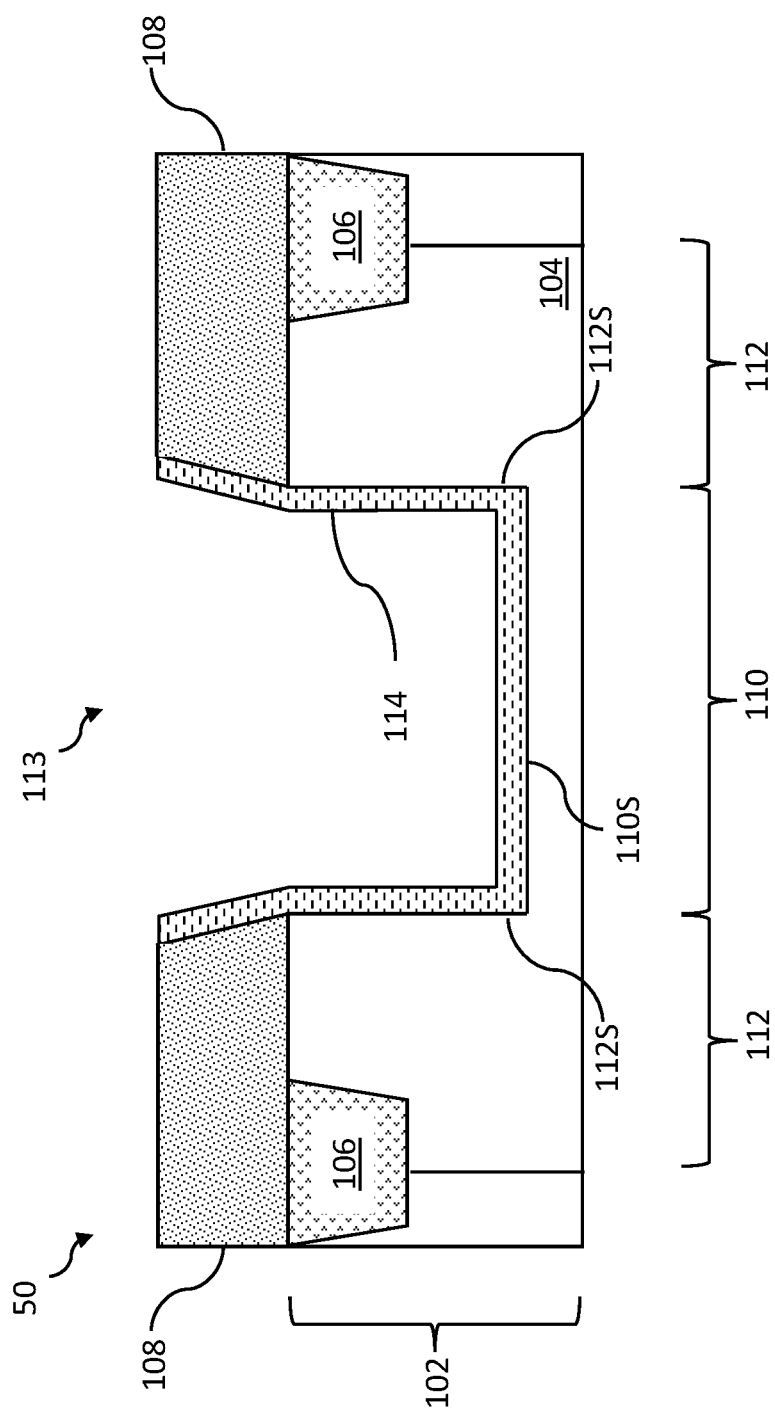
FIG. 3 shows a cross-sectional view of forming an insulative layer according to embodiments of the disclosure.

Referring now to FIG. 3, embodiments of the disclosure may include depositing an insulative material 114 over exposed materials to cover exposed portions of well cavity 113. For instance, insulative material 114 may form over upper surface 110U of first portion 110, sidewall surface(s) 112S of second portion 112, and/or sidewall surface(s) 108S of insulative layer 108. Insulative material 114 may include an oxide, insulative semiconductor, etc., to isolate one region within substrate 102 from an adjacent region(s) and may have a composition similar to or different from insulative layer 108. Subsequent processing of insulative material 114 may be useful, for example, to form an insulative collar on exposed surface(s) of well cavity 113.

Figure 4:
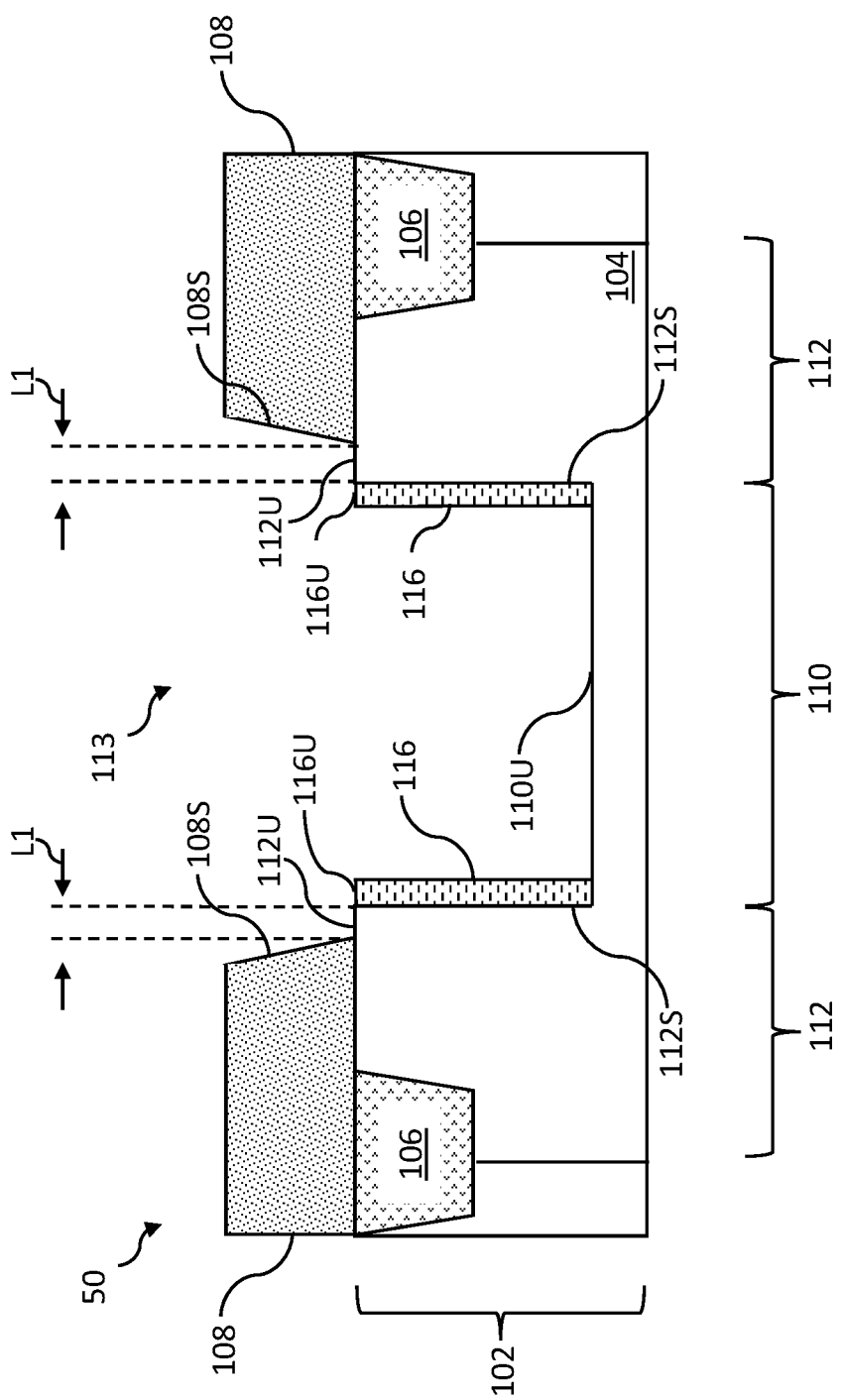
FIG. 4 shows a cross-sectional view of forming an insulative collar according to embodiments of the disclosure.

Turning to FIG. 4, additional processing, e.g., of insulative material 114 may include selectively removing portion(s) of insulative material 114 over portion(s) of substrate 102 using, e.g., a mask (not shown) with an opening at a targeted position to expose insulative material 114. Selectively removing portion(s) of insulative material 114 may include, for example, Anisotropic etching to remove selected portion(s) of insulative material 114 over doped well 104 to yield an insulative collar 116.

As shown in FIG. 4, continued processing may include selectively removing portion(s) of insulative material 114 on upper surface 110U of first portion 110 of doped well 104 to yield insulative collar 116. Remnants of insulative material 114 form insulative collar 116 on at least part of upper surface 110U of first portion 110 and sidewall surface(s) 112S of second portion 112 to electrically isolate regions of doped well 104. Insulative collar 116 may laterally surround exposed portions of upper surface 110U of first portion 110. In the present embodiment, insulative collar 116 extends along sidewall surface(s) 112S of second portion 112 from upper surface 110U of first portion 110 to an upper surface 116U of insulative collar 116. Upper surface 116U of insulative collar 116 may be substantially coplanar with an upper surface 112U of second portion 112 that may be formed by selectively removing portion(s) of insulative material 114 from sidewall surface(s) 108S of insulative layer 108. The method may include selectively removing portion(s) of insulative layer 108, e.g., anisotropic etching, to expose upper surface 112U of second portion 112, such that sidewall surface(s) 108S of insulative layer 108 are horizontally offset from sidewall surface(s) 112S of second portion 112 by a length (L1). Upper surfaces 110U, 112U of portions 110, 112 of doped well 104 may be useful to form additional components of a photodetector structure in subsequent processing.

Figure 5:
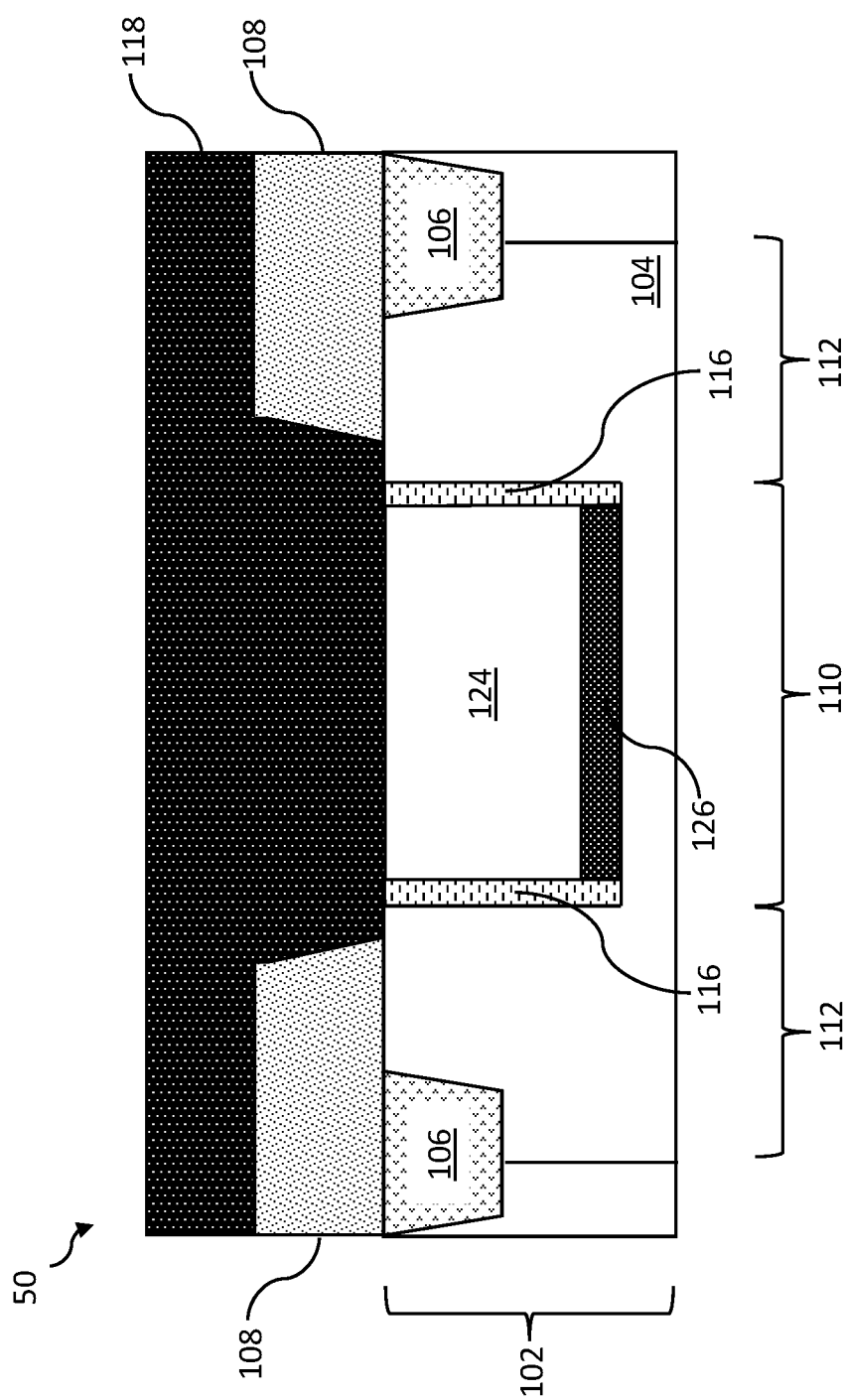
FIG. 5 shows a cross-sectional view of forming a first undoped semiconductor layer and a second undoped semiconductor layer according to embodiments of the disclosure.
Figure 10:
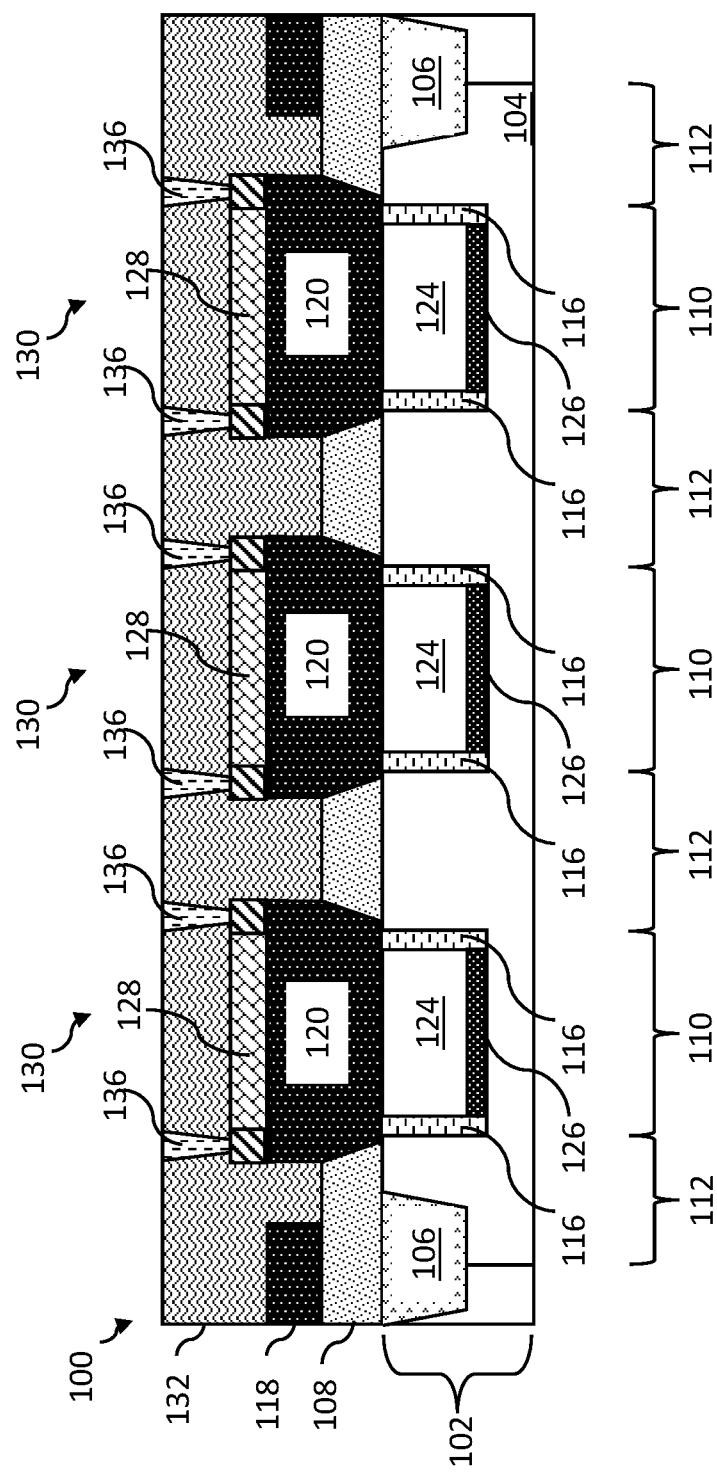
FIG. 10 shows a cross-sectional view of a photodetector structure according to further embodiments of the disclosure.

Referring now to FIG. 5, embodiments of the disclosure may include forming a semiconductor material 118 over doped well 104. Semiconductor material 118 may include a semiconductor material such as, e.g., epitaxial germanium (epi-Ge). Forming semiconductor material 118 may include epitaxial growth on upper surface 112U of second portion 112 of doped well 104. The method may include forming epitaxial germanium on upper surface 112U of second portion 112 to yield semiconductor material 118 that extends over insulative layer 108, first portion 110, and insulative collar 116. The method may include forming epitaxial germanium on one or more portions of upper surface 112U of second portion 112, the epitaxial germanium may coalesce to yield semiconductor material 118. For instance, as shown in FIG. 4, upper surface 112U of second portion 112 includes two exposed portions that are horizontally separated by first portion 110. Forming semiconductor material 118 includes forming epitaxial germanium on both exposed portions of upper surface 112U of second portion 112. The epitaxial germanium coalesces over first portion 110 of doped well 104 to yield semiconductor material 118. Semiconductor material 118 may be self-coalesced due to the process method described herein. Semiconductor material 118 may be self-planarized, such that an upper surface of semiconductor material 118 is substantially planar without requiring traditional planarization techniques. In some embodiments, semiconductor material 118 may self-planarize and/or self-coalesce with semiconductor material epitaxially grown on adjacent surfaces and/or adjacent cavities of substrate 102 (not shown; FIG. 10). Subsequent processing of semiconductor material 118 may be useful to form, e.g., a first semiconductor layer 120 of a photodetector structure as discussed herein (FIG. 6).

As further shown in FIG. 5, embodiments of the disclosure may include forming a second semiconductor layer 126 on upper surface 110U of first portion 110. Second semiconductor layer 126 may include a semiconductor material such as, e.g., epitaxial germanium (epi-Ge). Forming second semiconductor layer 126 may include epitaxial growth of semiconductor material (e.g., epi-Ge) on upper surface 110U of first portion 110. Second semiconductor layer 126 may be formed simultaneously with semiconductor material 118. In the present embodiment, second semiconductor layer 126 is positioned horizontally adjacent to trench isolation structure 106. In alternative embodiments discussed herein (FIG. 9), semiconductor layer 126 is positioned within trench isolation structure 106.

As further shown in FIG. 5, embodiments of the disclosure may include forming an air gap 124 vertically between semiconductor material 118 and first portion 110 of doped well 104. Insulative collar 116 may laterally surround air gap 124 such that insulative collar 116 horizontally separates air gap 124 from second portion 112. In the present embodiment, air gap 124 is positioned vertically between semiconductor material 118 and second semiconductor layer 126. In alternative embodiments discussed herein (FIG. 7), air gap 124 is vertically between semiconductor material 118 and a portion of insulative collar 116 on first portion 110 of doped well 104. Air gap 124 may be useful to increase light absorption in a photodetector structure relative to a photodetector structure without air gap 124.

Figure 6:
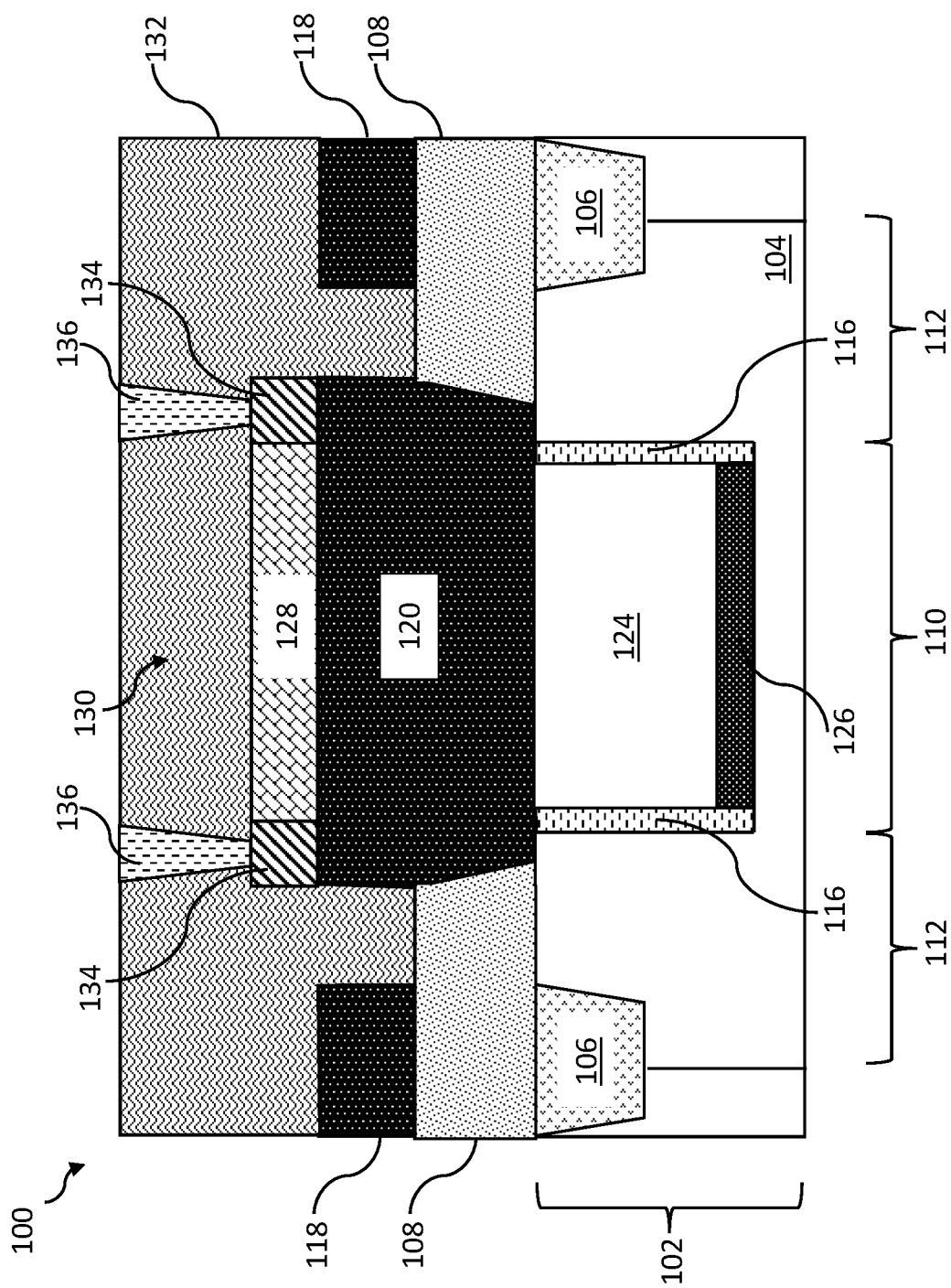
FIG. 6 shows a cross-sectional view of a photodetector structure according to embodiments of the disclosure.

Referring now to FIG. 6, embodiments of the disclosure may include additional processing to form a photodetector structure 100. Photodetector structure 100 includes a first semiconductor layer 120 over doped well 104. Forming first semiconductor layer may include additional processing, e.g., etching, using a mask (not shown) to selectively remove portion(s) of semiconductor material 118 to yield first semiconductor layer 120 over doped well 104. Remaining portions of semiconductor material 118 may remain laterally adjacent to first semiconductor layer 120. In the present embodiment, first semiconductor layer 120 includes epitaxial germanium on upper surface 112U of second portion 112 of doped well 104. First semiconductor layer 120 extends over first portion 110 of doped well 104 and forms air gap 124 vertically therebetween. A lower portion of first semiconductor layer 120 is laterally surrounded by insulative layer 108, and an upper portion of first semiconductor layer 120 is laterally surrounded by an inter-layer dielectric (ILD) 132. First semiconductor layer 120 may be useful to receive electromagnetic radiation from an electromagnetic source (not shown), transmit electromagnetic radiation into the air gap, and receive reflected electromagnetic radiation passing back through the air gap.

As further shown in FIG. 6, photodetector structure 100 includes second semiconductor layer 126 on upper surface 110U of first portion 110, and third semiconductor layer 128 over first semiconductor layer 120. Second semiconductor layer 126 includes epitaxial germanium laterally surrounded by insulative collar 116 to electrically isolate second semiconductor layer 126 and second portion 112 of doped well 104. Air gap 124 is positioned vertically between first semiconductor layer 120 and second semiconductor layer 126. Second semiconductor layer 126 may be useful to receive electromagnetic radiation passing through air gap 124 and reflect electromagnetic radiation back toward first semiconductor layer 120. Third semiconductor layer 128 may include forming a semiconductor material such as, e.g., polysilicon (poly-Si), on an upper surface of first semiconductor layer 120. In some embodiments, additional processing may include implanting a p-type or an n-type dopant in third semiconductor layer 128 to form a PIN photodetector structure.

As further shown in FIG. 6, embodiments of the disclosure may include additional processing to form photodetector structure 100. The method may include forming one or more implants 134 within third semiconductor layer 128. Implants 134 may include a p-type dopant or an n-type dopant. In the present embodiment, photodetector structure 100 includes two implants 134, one implant 134 includes a p-type dopant and the other implant 134 includes an n-type dopant. The method may further include depositing ILD 132 over exposed portions of preliminary structure 50 (FIG. 5) to electrically isolate photodetector structure 100. ILD 132 may include, for example, borophosphosilicate glass (BPSG). The method may include forming a contact structure 136 disposed within ILD 132 and electrically coupled to third semiconductor layer 128 via implants 134. Any appropriate middle-of-line (MOL) and back-end-of-line (BEOL) processing may be carried out to form contact structure(s) 136 to third semiconductor layer 128. As the processes to form contact structures are well known, no further details will be provided. Any necessary etch stop layers, e.g., single, or dual contact etch stop layers, may be employed, and any silicidation can be carried out as known in the field as part of the processes.

FIG. 6 depicts one embodiment of photodetector structure 100. In the present embodiment, photodetector structure 100 includes a plurality of semiconductor layers over doped well 104 within substrate 102 and horizontally adjacent to trench isolation structure(s) 106. The plurality of semiconductor layers including first semiconductor layer 120 on second portion 112 of doped well 104, second semiconductor layer 126 on first portion 110 of doped well 104, and third semiconductor layer 128 on first semiconductor layer 120. First and second semiconductor layers 120, 126 include epitaxial germanium, and third semiconductor layer 128 includes polysilicon. Air gap 124 is positioned vertically between first semiconductor layer 120 and second semiconductor layer 126. Air gap 124 is configured to receive photons (not shown) that pass through first semiconductor layer 120 and reflect the photons back to first semiconductor layer 120 for conversion to electrons, and thus increase efficiency of photodetector structure 100. Photodetector structure 100 further includes insulative collar 116 on first portion 110, and laterally surrounding second semiconductor layer 126 and air gap 124. Insulative collar 116 includes an oxide that extends vertically from first portion 110 to first semiconductor layer 120 and has a substantially uniform horizontal thickness throughout. Photodetector structure 100 further includes insulative layer 108 on second portion 112 of doped well 104 and laterally surrounding a lower portion of first semiconductor layer 120. Remnants of semiconductor material 118 are over insulative layer 108 and horizontally adjacent to, but separated from, an upper portion of first semiconductor layer 120 above insulative layer 108. Photodetector structure 100 further includes contact structure 136 extending through ILD 132 and electrically coupled to third semiconductor layer 128 via implants 134. Contact structure 136 may couple photodetector structure 100 to one or more other electronic components (not shown). As shown in FIG. 6, photodetector structure 100 includes a pixel 130, however any number of pixels 130 can be included to form photodetector structure 100 such as, e.g., an array of pixels 130 (FIG. 10). In the present embodiment, pixel 130 includes doped well 104, first semiconductor layer 120, second semiconductor layer 120, third semiconductor layer 130, air gap 124, implants 134, and contact structure 136. Pixel 130 is configured to generate an electrical signal in response to detecting photons from a transmission source (not shown). Photodetector structure 100 may be part of a photonics integrated circuit (PIC) that includes one or more other electrical devices (not shown).

Figure 7:
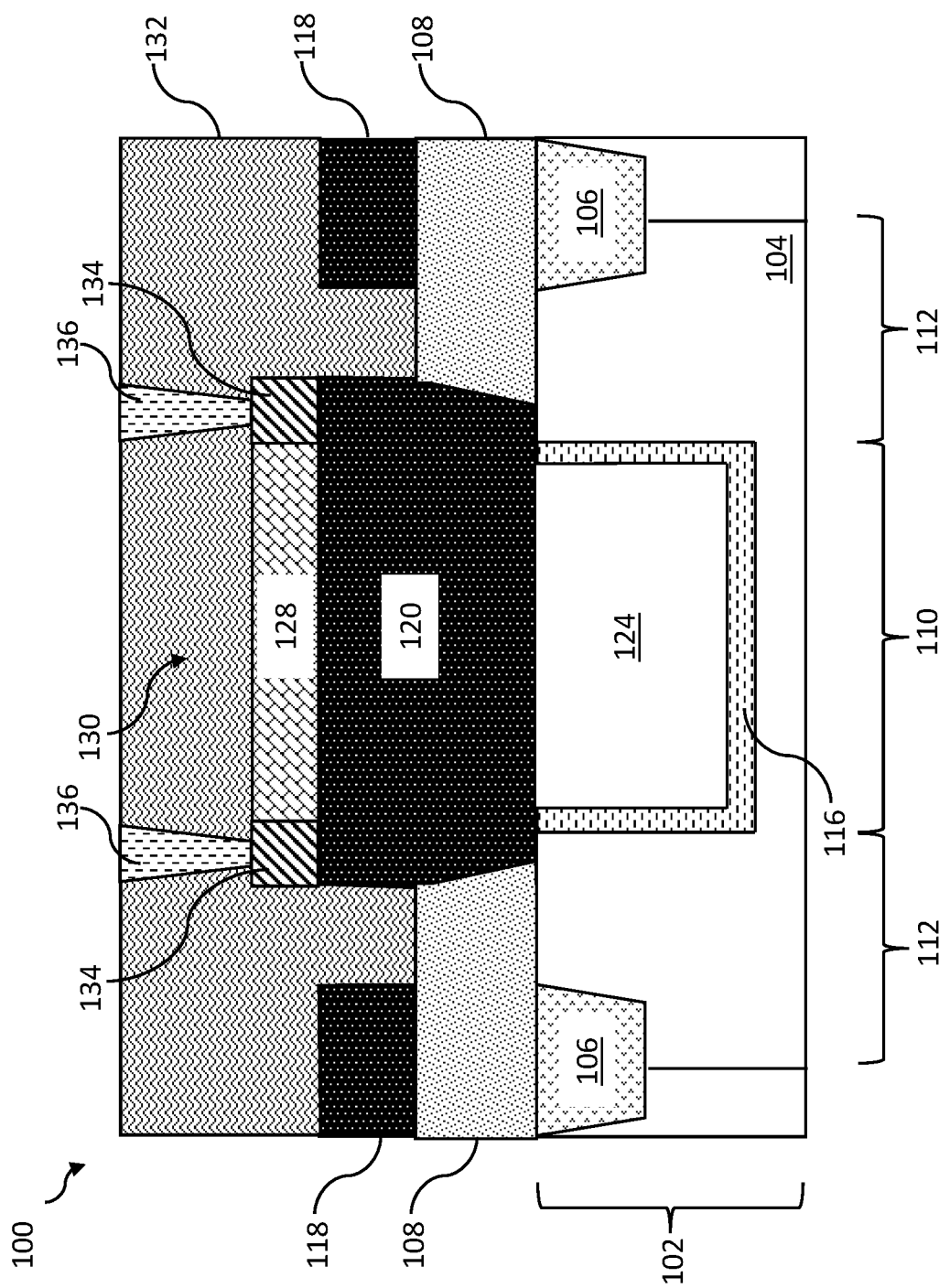
FIG. 7 shows a cross-sectional view of a photodetector structure according to further embodiments of the disclosure.

FIG. 7 depicts another embodiment of photodetector structure 100 including insulative collar 116 over upper surface 110U of first portion 110 of doped well 104. Photodetector structure 100 is substantially similar to the embodiment described in FIG. 6 without second semiconductor layer 126. Forming the photodetector structure 100 embodiment shown in FIG. 7 may include using a mask (not shown) to prevent additional processing from selectively removing portion(s) of insulative material 114 over first portion 110 of doped well 104 (FIGS. 3-4). In the present embodiment, air gap 124 extends vertically between first semiconductor layer 120 and a portion of insulative collar 116 on upper surface 110U of first portion 110. Remaining portion(s) of insulative collar 116 laterally surround air gap 124 and electrically isolate air gap 124 from second portion 112 of doped well 104.

Figure 8:
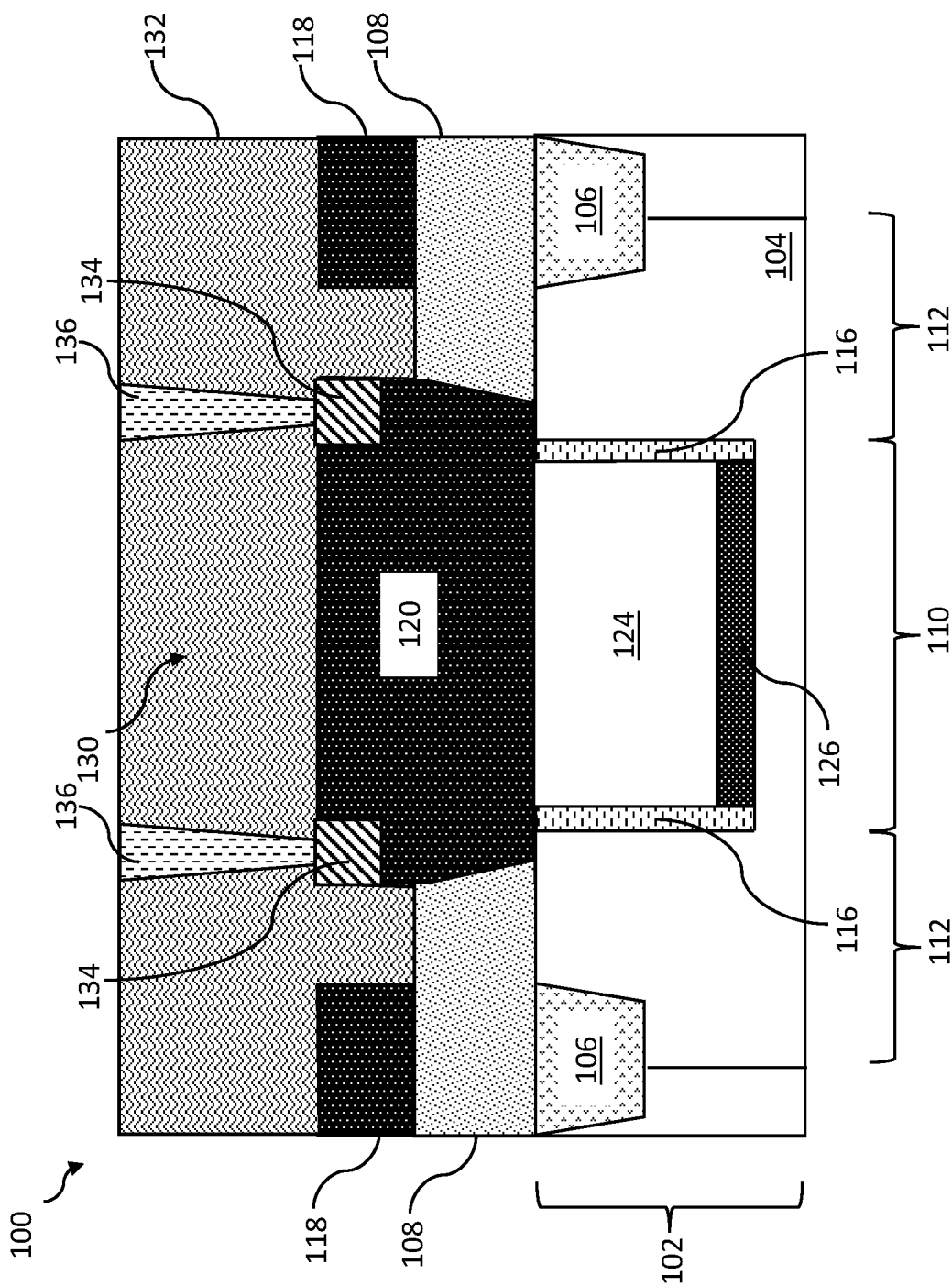
FIG. 8 shows a cross-sectional view of a photodetector structure according to further embodiments of the disclosure.

FIG. 8 depicts another embodiment of photodetector structure 100 including implants 134 positioned within first semiconductor layer 120. Photodetector structure 100 is substantially similar to the embodiment described in FIG. 6 without polysilicon (e.g., third semiconductor layer 128) over first semiconductor layer 120. Implants 134 are formed within first semiconductor layer 120 and contact structure 136 electrically couples to first semiconductor layer 120 via implants 134.

Figure 9:
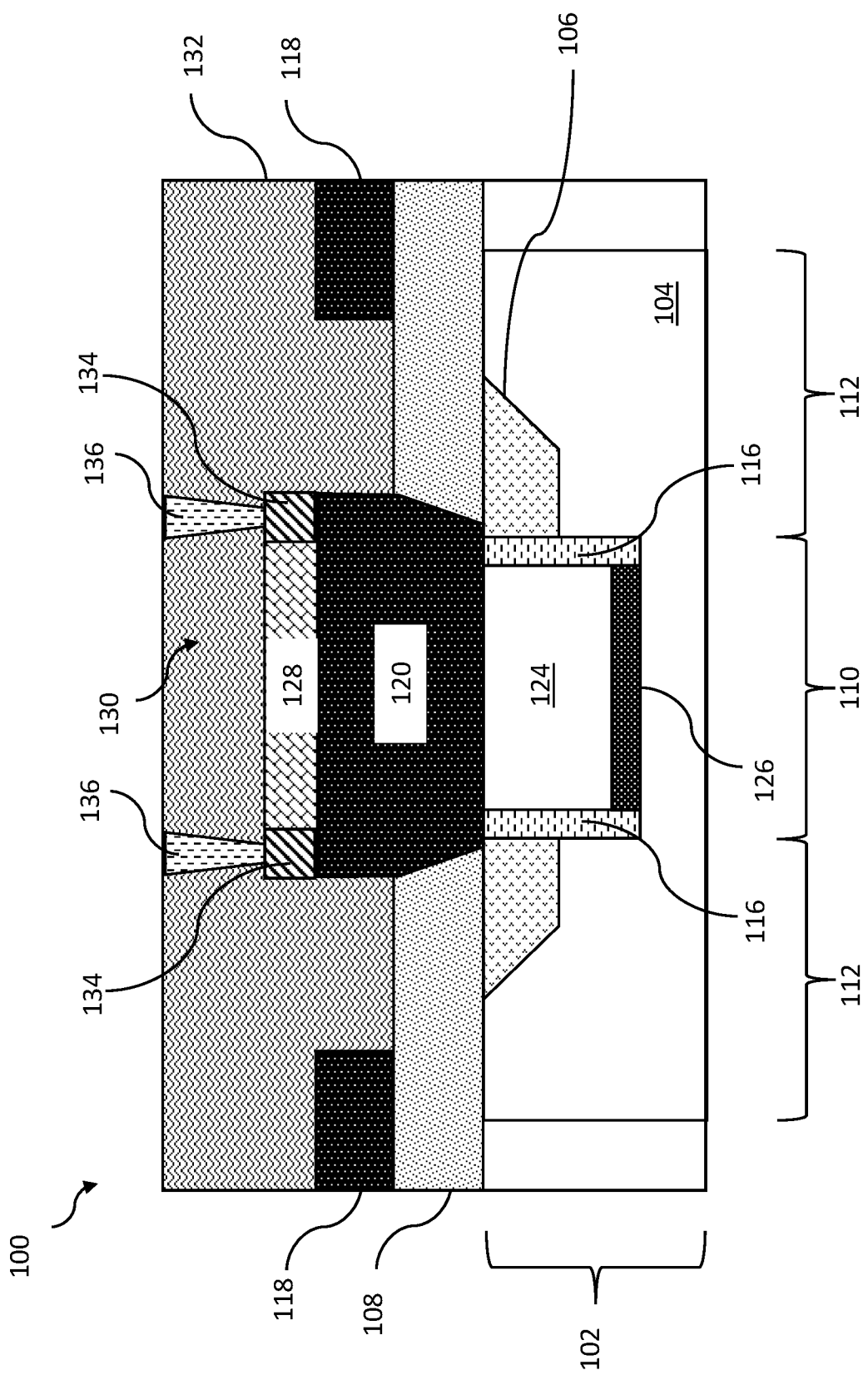
FIG. 9 shows a cross-sectional view of a photodetector structure according to further embodiments of the disclosure.

FIG. 9 depicts another embodiment of photodetector structure 100 positioned within trench isolation structure 106. Forming photodetector structure 100 within trench isolation structure 106 includes selectively removing portion(s) of trench isolation structure 106 to form a cavity within trench isolation structure 106. The cavity may extend below a lower surface of trench isolation structure 106. Selectively removing portions of trench isolation structure 106 may include using, e.g., a mask (not shown) to expose a target portion of trench isolation structure 106. In the present embodiment, photodetector structure 100 includes first semiconductor layer 120 over trench isolation structure 106, second semiconductor layer 126 below trench isolation structure 106, and air gap 124 laterally surrounded by trench isolation structure 106.

FIG. 10 depicts another embodiment of photodetector structure 100, including a plurality of pixels 130 positioned horizontally adjacent to each other in an array. Each pixel 130, and method of forming each pixel 130, is substantially similar to the embodiment described in FIG. 6. The method may include forming a plurality of horizontally-adjacent cavities (not shown) within substrate 102. The method may further include continued processing as discussed in detail above regarding FIGS. 3-6. For instance, the method may include depositing insulative material to form insulative collar 116 within a respective cavity of a pixel 130. The method may include forming epitaxial germanium on upper surfaces of second portion 112 of doped well 104. The epitaxial germanium may be self-coalesced as described above to form a single layer of epitaxial germanium (not shown; FIG. 5) over doped well 104, and continued processing yields a plurality of first semiconductor layers 120 for a respective one of the plurality of pixels 130. Although FIG. 10 depicts three pixels 130 arranged horizontally within substrate 102, embodiments of the present disclosure encompass any number of pixels positioned in various arrangements. For instance, in some embodiments, photodetector structure may include 1,000 pixels that are horizontally adjacent to each other.

Embodiments of the present disclosure provide technical and commercial advantages, and some examples of such advantages are described herein. Embodiments of the disclosure may improve operational performance for photodetector structures by lowering dark current and improve quantum efficiency. Photodetector structures including the air gap embodiments described herein may lead to an increase in light absorption. Photons that are not converted into electrons in a germanium layer enter the air gap and the photons reflect back to the germanium layer for conversion to electrons. Photons reflect back due to a dielectric constant differential between germanium and the air gap.

The photodetector structure 100 as described above receives optical signals, e.g., infrared, from a transmission source (not shown). The transmission source may include light-transmissive materials configured to direct optical signals to photodetector structure 100. Photodetector structure 100 coverts those optical signals into electrical signals using doped well 104, first semiconductor layer 120, and air gap 124. These electrical signals may be transmitted from photodetector structure 100 to one or more other electrical devices (not shown) through contact structure 136.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing structures as part of either (a) an intermediate product, such as a motherboard, or (b) an end product. The end product can be any product that includes integrated circuit chips, ranging from toys and other low-end applications to advanced computer products having a display, a keyboard or other input structure, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" or "substantially" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photodetector structure, comprising:
a first semiconductor layer over a first portion of a doped well in a substrate;
an air gap within a trench isolation structure and vertically between the first semiconductor layer and the first portion of the doped well; and
an insulative collar laterally surrounding the air gap, the insulative collar on the first portion of the doped well between the air gap and a second portion of the doped well.

2. The photodetector structure of claim 1, wherein the first semiconductor layer includes epitaxial germanium, and the insulative collar includes an oxide.

3. The photodetector structure of claim 1, wherein the first semiconductor layer includes coalesced germanium.

4. The photodetector structure of claim 1, wherein the first semiconductor layer is on an upper surface of the second portion of the doped well and extends over the air gap.

5. The photodetector structure of claim 4, wherein an upper surface of the insulative collar is substantially coplanar with the upper surface of the second portion of the doped well.

6. The photodetector structure of claim 1, further comprising:
a second semiconductor layer on the first portion of the doped well, wherein the insulative collar laterally surrounds the second semiconductor layer; and
a third semiconductor layer over the first semiconductor layer.

7. The photodetector structure of claim 6, wherein the second semiconductor layer includes epitaxial germanium, and the third semiconductor layer includes polysilicon.

8. The photodetector structure of claim 1, wherein the air gap, the insulative collar, and the first semiconductor layer are horizontally adjacent to a trench isolation structure.

9. A photodetector structure, comprising:
a first semiconductor layer over a first portion of a doped well in a substrate;
a second semiconductor layer on the first portion of the doped well;
an air gap vertically between the first semiconductor layer and the second semiconductor layer;
a third semiconductor layer over the first semiconductor layer; and
an insulative collar laterally surrounding the air gap and the second semiconductor layer, the insulative collar on the first portion of the doped well between the second semiconductor layer and a second portion of the doped well.

10. The photodetector structure of claim 9, further comprising:
- a first insulative layer over the second portion of the doped well, the first insulative layer horizontally contacting a lower portion of the first semiconductor layer;
- an inter-layer dielectric (ILD) over the first insulative layer; and
- a contact structure disposed within the ILD, the contact structure electrically coupled to the first semiconductor layer.

11. The photodetector structure of claim 10, wherein the first insulative layer includes an oxide, and the ILD includes borophosphosilicate glass.

12. The photodetector structure of claim 9, wherein the first semiconductor layer is on an upper surface of the second portion of the doped well and extends over the air gap.

13. The photodetector structure of claim 9, wherein the first semiconductor layer and the second semiconductor layer each include epitaxial germanium, and the third semiconductor layer includes polysilicon.

14. A method of forming a photodetector structure, the method comprising:
- forming a first semiconductor layer over a first portion of a doped well in a substrate;
- forming an air gap within a trench isolation structure of a substrate vertically between the first semiconductor layer and the first portion of the doped well; and
- forming an insulative collar laterally surrounding the air gap, the insulative collar on the first portion of the doped well between the air gap and a second portion of the doped well.

15. The method of claim 14, wherein forming the first semiconductor layer includes epitaxially growing germanium on an upper surface of the second portion of the doped well and the first semiconductor layer extending over the air gap.

16. The method of claim 14, further comprising:
- forming a second semiconductor layer on the first portion of the doped well, wherein the insulative collar laterally surrounds the second semiconductor layer; and
- forming a third semiconductor layer over the first semiconductor layer.

17. The method of claim 16, wherein forming the second semiconductor layer includes epitaxially growing germanium, and forming the third semiconductor layer includes depositing polysilicon.

18. The method of claim 14, further comprising:
- forming the trench isolation structure within the substrate.

19. The method of claim 14, further comprising:
- forming a trench isolation structure within the substrate, wherein the air gap, the insulative collar, and the first semiconductor layer are horizontally adjacent to the trench isolation structure.

* * * * *